United States Patent
Naberhuis et al.

(10) Patent No.: US 7,514,859 B2
(45) Date of Patent: Apr. 7, 2009

(54) ULTRAVIOLET EMITTER DISPLAY APPARATUS

(75) Inventors: Steven L. Naberhuis, Fremont, CA (US); Huei Pel Kuo, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 245 days.

(21) Appl. No.: 11/019,582

(22) Filed: Dec. 20, 2004

(65) Prior Publication Data

US 2006/0132021 A1 Jun. 22, 2006

(51) Int. Cl.
*H01J 1/62* (2006.01)
(52) U.S. Cl. .................... 313/501; 313/506
(58) Field of Classification Search .......... 257/59, 257/72, 88, 89, 98, 100, 433; 313/498–512
See application file for complete search history.

(56) References Cited

U.S. PATENT DOCUMENTS

| | | | |
|---|---|---|---|
| 5,726,464 A | * | 3/1998 | Kumomi et al. ............ 257/103 |
| 6,700,322 B1 | * | 3/2004 | Duggal et al. ............. 313/504 |
| 7,030,555 B2 | * | 4/2006 | Nakamura et al. .......... 313/504 |
| 2002/0185965 A1 | * | 12/2002 | Collins et al. ............ 313/501 |
| 2004/0174117 A1 | * | 9/2004 | Han ..................... 313/506 |
| 2004/0183963 A1 | * | 9/2004 | Nakamura et al. ........... 349/69 |
| 2004/0212296 A1 | * | 10/2004 | Nakamura et al. .......... 313/504 |
| 2004/0251824 A1 | * | 12/2004 | Chen et al. ............. 313/506 |
| 2005/0051790 A1 | * | 3/2005 | Ueda ..................... 257/99 |

* cited by examiner

*Primary Examiner*—Peter Macchiarolo

(57) ABSTRACT

An ultraviolet emitter display apparatus includes a substrate layer, a pixel electronics layer positioned above the substrate layer, the pixel electronics layer including electronics to drive the ultraviolet emission display. Ultraviolet (UV) emitters may be located above the pixel electronics layer, where the UV emitters may comprise a layer of UV light emitting diodes (LEDs) or a combination of an electron acceleration layer and a UV emission layer. The design further includes a phosphor layer comprising a plurality of phosphor elements, either white phosphor elements in combination with color filters or color phosphor elements.

23 Claims, 5 Drawing Sheets

ULTRAVIOLET EMITTER DISPLAY APPARATUS

BACKGROUND OF THE INVENTION

1. Field of the Invention

The present invention relates generally to the field of display devices, and more particularly to screens and related hardware employed in color display devices.

2. Description of the Related Art

Currently available color display devices are fabricated using various materials in several different arrangements. State of the art emissive display devices include plasma displays (PDPs), conventional RGB LED displays, cathodoluminescence displays (CRTs) or organic light emitting diode displays (OLEDs). One class of displays, known as pseudo-emissive displays, are based on backlit liquid crystal display (LCD) technology. Each of these devices has certain benefits combined with, in many cases, significant drawbacks in fabrication, or at the very least performance or cost limitations.

PDPs have relatively limited lifetimes and are extremely costly to produce. CRTs are relatively heavy, bulky, and are limited in size. OLEDs have relatively limited lifetimes, and are particularly susceptible to blue degradation. Large LCD panels are relatively costly to produce. LCDs require expensive substrates to manufacture successfully, as well as expensive polarizers, both contributing to their high cost. PDPs require high voltage drivers, expensive components required for viewing, as well as relatively expensive substrates. Although OLEDs can be fabricated in a relatively inexpensive roll-to-roll process, the lifetimes of such devices circa 2004 are relatively limited.

The typical consumer seeks an excellent quality image from a color display at a low cost, where cost is typically a function of the components used and the fabrication process. Quality of the image is enhanced in the use of emissive component technologies rather than passive technologies. Further, the ability for the display to demonstrate a long lifetime is highly desirable, as replacement of the display after only a few years of use is a significant drawback. Finally, consumers tend to value lightweight displays that can be easily transported and installed and that do not take up significant room once installed.

Weight, thickness, durability, cost, ease of manufacture, lifetime, and picture quality are key considerations for color displays and display screens. It would be advantageous to offer a rear projection design that is lighter, thinner, less expensive, and offers an enhanced viewing experience over previous color display designs.

SUMMARY OF THE INVENTION

According to a first aspect of the present design, there is provided a display apparatus, comprising a substrate layer, a pixel electronics layer positioned above the substrate layer, a UV emission layer located above the pixel electronics layer, a phosphor layer comprising a plurality of phosphor elements positioned above the UV emission layer, and a surface layer covering the phosphor layer.

According to a first aspect of the present design, there is provided a method for fabricating a display apparatus. The method comprises providing a substrate layer, providing a pixel electronics layer positioned above the substrate layer, providing an electron acceleration layer positioned above the pixel electronics layer, providing an UV emission layer above the electron acceleration layer layer, providing a transparent conductor layer above the UV emission layer, providing a phosphor layer comprising a plurality of phosphor elements positioned above the transparent conductor layer layer, and providing a surface layer over the phosphor layer. The electron acceleration layer provides electrons whose energy is somewhat greater than the bandgap of the UV emission layer to stimulate UV emission from the UV emission layer.

According to a second aspect of the present design, there is provided an ultraviolet emission display apparatus, comprising a substrate layer, a pixel electronics layer positioned above the substrate layer, the pixel electronics layer comprising electronics to drive the ultraviolet emission display apparatus, an UV emission layer located above the pixel electronics layer, the UV emission layer comprising a layer of UV LEDs, a transparent conductor layer above the UV emission layer, and a phosphor layer comprising a plurality of phosphor elements, the phosphor layer positioned above the transparent conductor layer, and providing a surface layer over the phosphor layer.

These and other objects and advantages of all aspects of the present invention will become apparent to those skilled in the art after having read the following detailed disclosure of the preferred embodiments illustrated in the following drawings.

DESCRIPTION OF THE DRAWINGS

The present invention is illustrated by way of example, and not by way of limitation, in the figures of the accompanying drawings in which.

DETAILED DESCRIPTION OF THE INVENTION

The present design is a relatively lightweight, thin, color display fabricated from UV light emitters. The emission layer can be either an array of ultraviolet (UV) LEDs or a material that when excited by ballistic electrons, having electron energy levels in the range of approximately 5 to 20 eV, emits UV light.

Operation of UV LEDs are as follows. UV LED emitters are available from various vendors, including Nichia Corporation of Tokushima, Japan. In general, UV LEDs convert UV light into red, green, and blue light using RGB phosphors, or white phosphors and appropriate color filters. Phosphors may be exposed to some form of excitation, such as electrons, photons, current, and so forth. The phosphors so exposed reemit absorbed energy in the form of light, usually in the longer wavelength region, an effect known as luminescence.

Because LEDs are monochromatic by nature, phosphors may be used in so-called white LEDs to achieve white light in a simple and efficient manner. Different types of phosphors may be selected based on desired emission and absorption requirements of the application. To achieve sufficient brightness, a high intensity LED excites the phosphor to emit the desired color which can be combined with other colors to produce a light perceived as white. Phosphors can be made of various materials, such as zinc sulfide or yttrium oxides and may be doped with transition metals (such as Ag, Mn, Zn, and so forth) or rare earth metals (Ce, Eu, Th, and so forth) to provide colors.

Although individual red, green, and blue LEDs may be used to construct the extremely large displays used, for example, in football stadiums, the different materials providing the red, green and blue light in such extremely large displays present certain difficulties when the technology is employed to make conventional TV-sized screens. Incorporating these different materials would be prohibitively expensive for home use and conventional television applications.

The early Nichia "white" LED used a blue light emitting Gallium Indium Nitride chip coated with yellow phosphor. As noted, current UV LED technology employs a UV LED with some combination of RGB (red, green, blue) phosphors, thereby improving color gamut.

Figure 1:
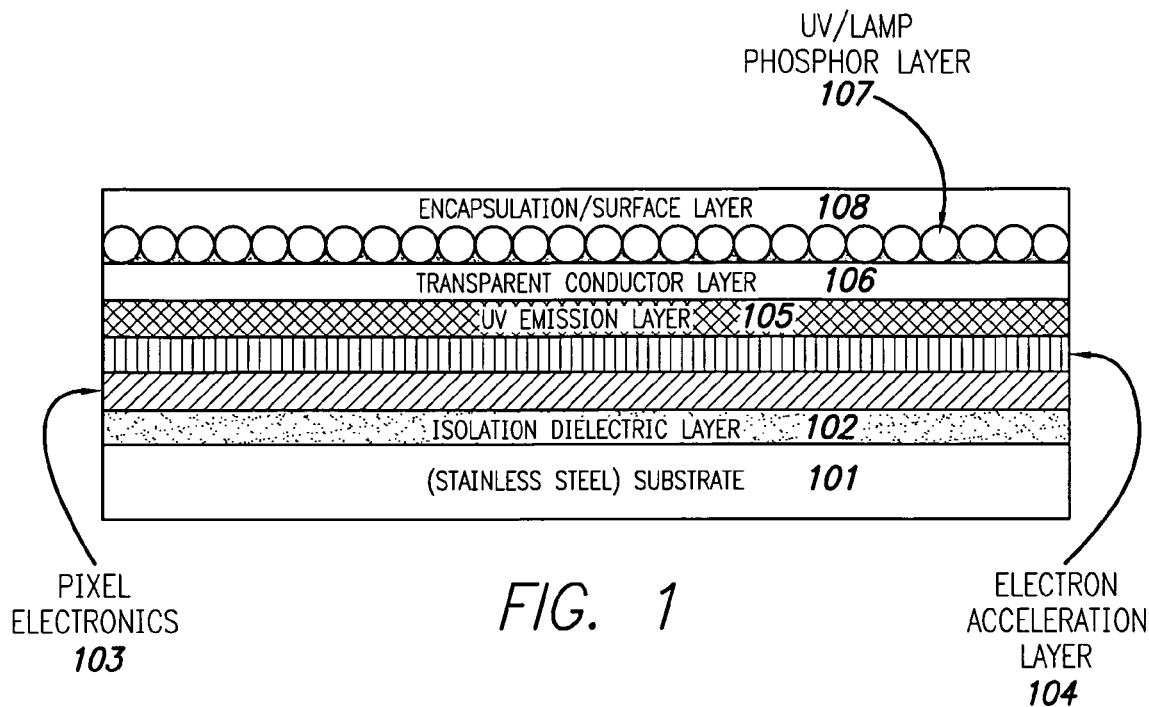
FIG. 1 illustrates an embodiment of a cross section of a display apparatus with an electron acceleration layer and a stainless steel substrate.

The present design uses a substrate material that may comprise stainless steel or another relatively inexpensive, dimensionally stable material such as glass, metal, or plastic. If a metal backplane/substrate is employed, a dielectric layer may be employed to separate the metal from the pixel electronics and the drive or address lines. FIGS. 1-5 illustrate various display constructs for single pixels of a given color based on UV light emitters according to the present design. A cross section of one embodiment of the current design is illustrated in FIG. 1. From FIG. 1, a stainless steel substrate 101 is formed, covered by an isolation dielectric 102. Pixel electronics 103 are located atop the isolation dielectric 102, with an electron acceleration layer 104 on the pixel electronics 103. Atop the electron acceleration layer 104 is an UV emission layer 105, a transparent conductor 106, the UV/lamp phosphor layer 107, shown here as a series of abutting spherical particles, below an encapsulation or surface layer 108.

Use of the terms "above" or "on" are used herein to imply direction and are directed to general fabrication of the display device, where the substrate comprises a bottom or base layer, with other layers formed "above" or "on" the device. However, use of directional terms are not intended to be limiting, but instead to convey a general positional relationship between the components of the design disclosed and claimed.

As with the other embodiments shown herein, the electron acceleration layer 104 may be formed of materials including but not limited to porous silicon and carbon nanotubes. If an electron acceleration layer is employed, such as electron acceleration layer 104, the emission layer, such as UV emission layer 105, can be composed of a material such as insulating or semiconducting ZnO, $Ga_xAl_{(1-x)}N$, typically either doped or modified, or the like. Deposition of such a material used in the emission layer may be accomplished through plasma spraying or like techniques. Alternately, deposition may occur by printing particulate material, where the particulate material is later heat treated, or material is applied using conventional CVD (chemical vapor deposition) methods. The surface layer 108 may be formed of glass or plastic, where the surface layer 108 serves not only as a transparent layer through which light can be emitted but as an encapsulation of the phosphors. Separate transparent surface or near-surface layers may be used, such as one for encapsulating the phosphors. A surface layer may comprise encapsulated phosphors or phosphor elements into a single uniform flat surface in combination with a covering layer over the single uniform flat surface, where the covering layer passes light energy.

Figure 2:
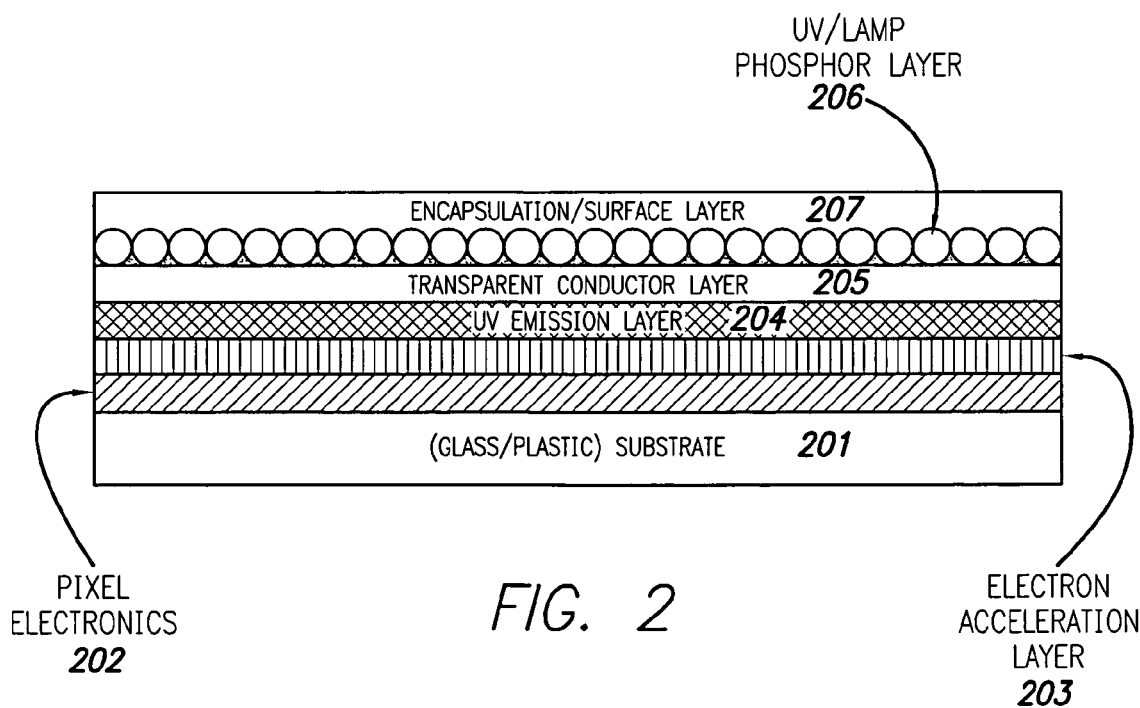
FIG. 2 shows an embodiment of a cross section of a display apparatus with an electron acceleration layer and a glass or plastic (non-conductive) substrate.

A cross section of an embodiment having a glass or plastic substrate layer 201 instead of a metal layer is illustrated in FIG. 2. From FIG. 2, glass or plastic substrate 201 is formed below pixel electronics 202 without the isolation dielectric such as is shown in FIG. 1. Electron acceleration layer 203 sits below UV emission layer 204, located below transparent conductor 205. Above the transparent conductor 205 is the UV/lamp phosphor layer 206 and the encapsulation or surface layer 207.

When UV/lamp phosphors are employed, emission from such phosphors is typically red, blue or green. Each color can be represented as a pixel for the purposes of descriptions herein, where a pixel is normally defined as a picture element in which sub-pixels exist for each of the colors red, blue and green. UV lamp phosphors include nanocrystalline phosphors.

Figure 3:
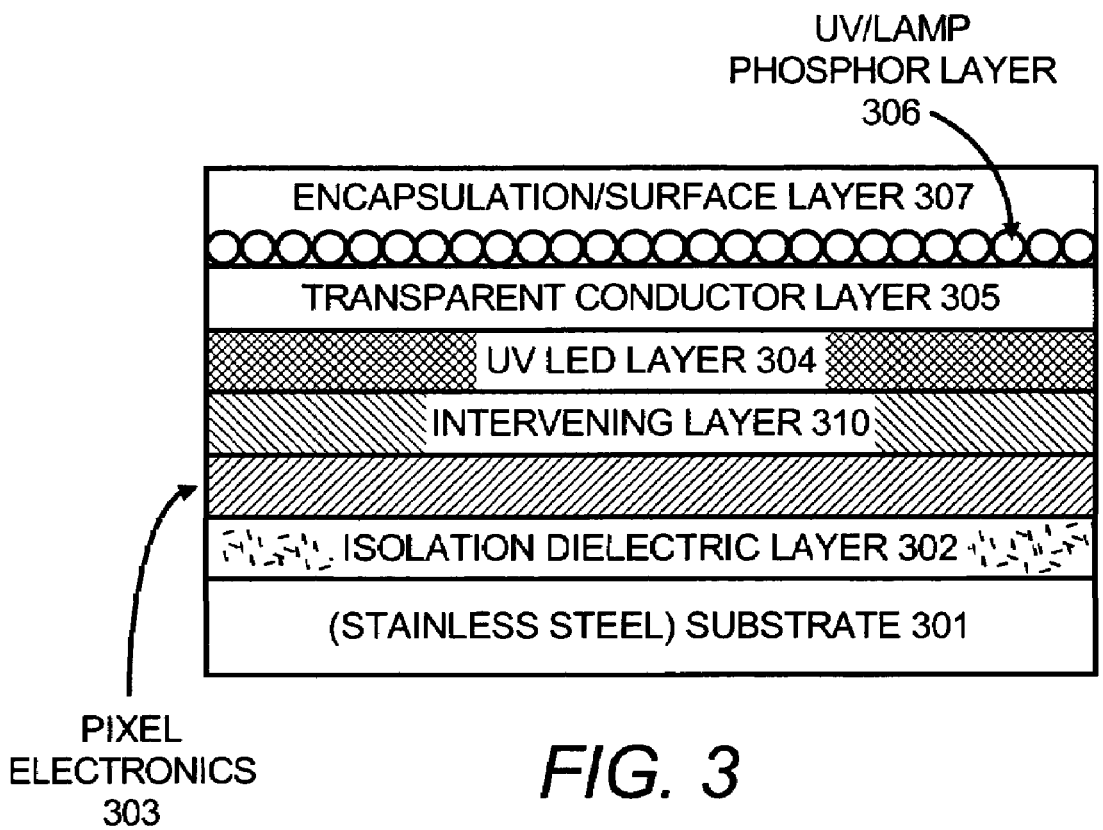
FIG. 3 is an embodiment of a cross section of a display apparatus with an UV LED layer and a stainless steel substrate.

The embodiment of FIG. 3 is similar to the embodiment of FIG. 1 but omits the electron acceleration layer and uses a UV emission layer, formed in a different manner than the UV emission layer of FIG. 1. From FIG. 3, the stainless steel substrate 101 is formed below isolation dielectric 302. Pixel electronics 303 are located atop the isolation dielectric 302, with a UV LED layer 304 atop the pixel electronics 303. Above the UV LED layer 304 are a transparent conductor 305, the UV/lamp phosphor layer 306, and encapsulation or surface layer 307.

Figure 4:
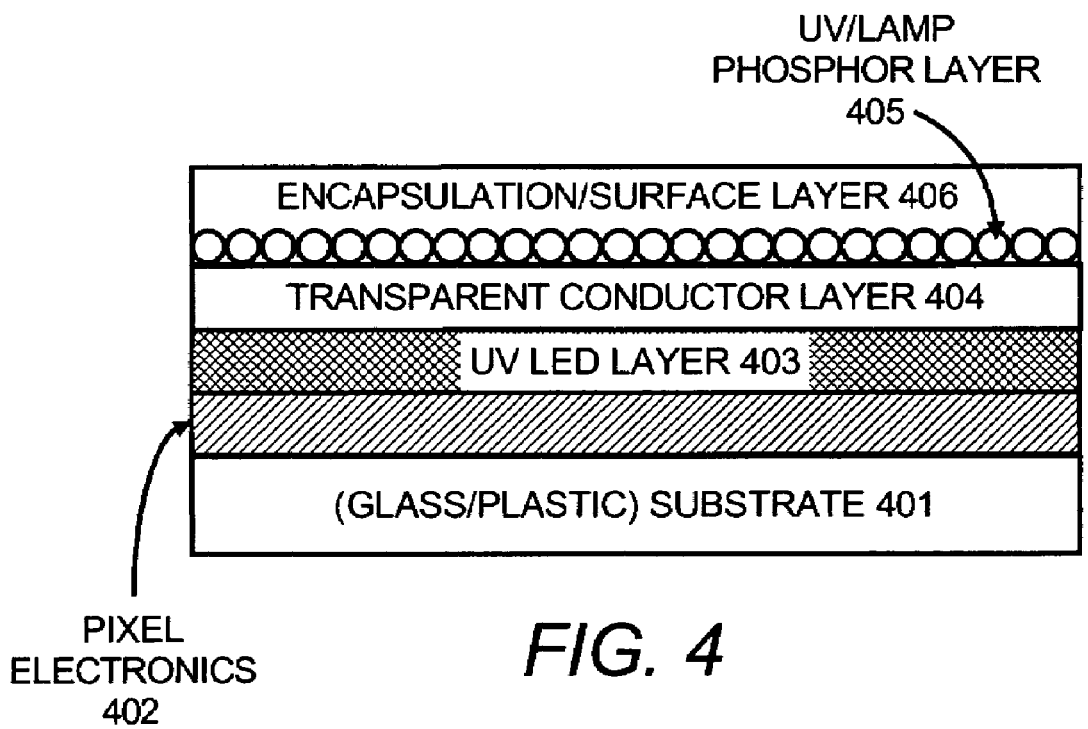
FIG. 4 illustrates an embodiment of a cross section of a display apparatus with an UV LED layer and a glass or plastic (non-conductive) layer.

The embodiment of FIG. 4 is similar to the embodiment of FIG. 2, but again omits the electron acceleration layer. From FIG. 4, glass or plastic substrate 401 is formed below pixel electronics 402 without the isolation dielectric. UV LED layer 403 is located above the pixel electronics 402. Above the UV LED layer 403 are a transparent conductor 404, the UV/lamp phosphor layer 405, and encapsulation or surface layer 406.

Figure 5:
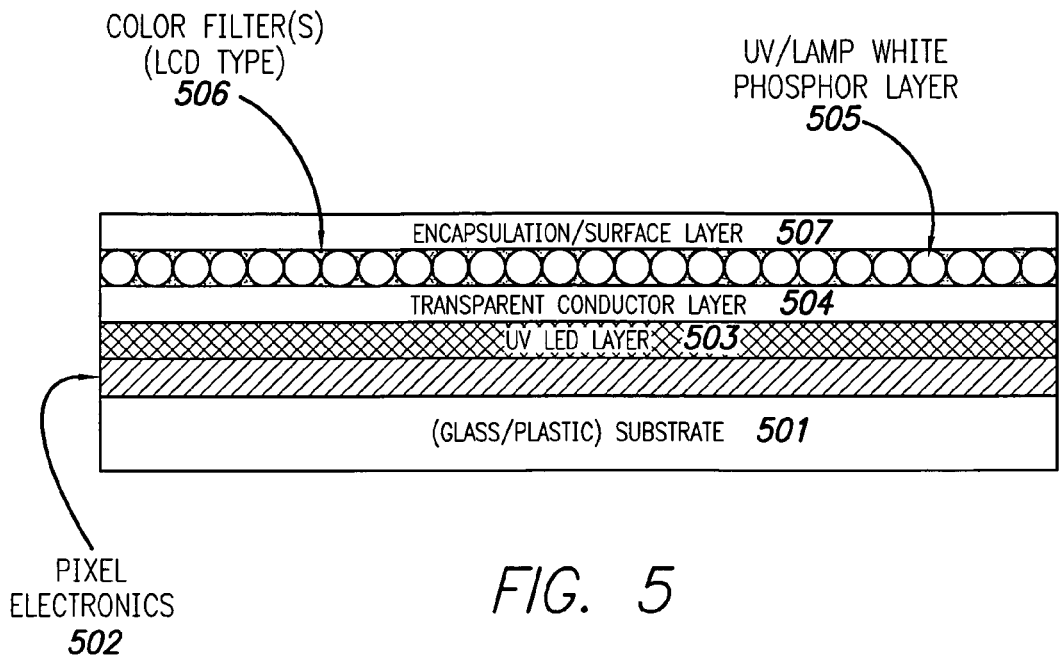
FIG. 5 shows an embodiment of a display apparatus with an UV/Lamp White Phosphor element arrangement and a set of LCD type color filters.
Figure 6:
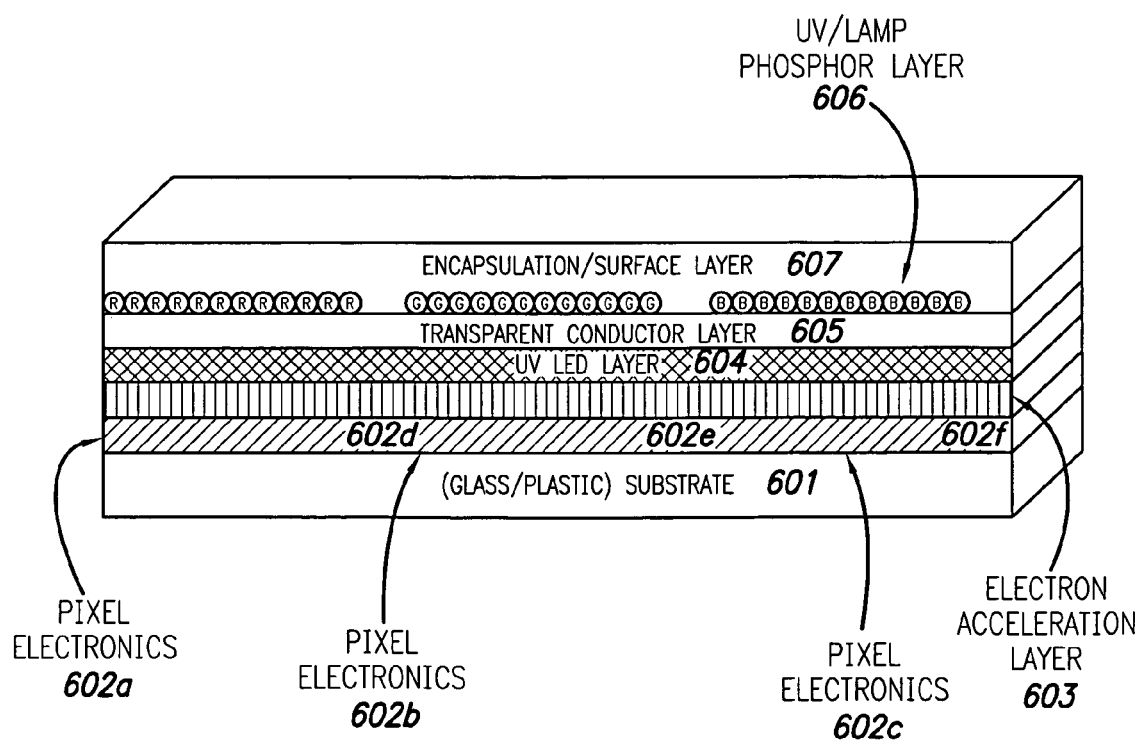
FIG. 6 illustrates a display apparatus embodiment illustrating the metal lines located within the pixel electronics.

The embodiment of FIG. 5 uses white UV/lamp phosphors in combination with LCD type color filters to produce the color pixel or pixels of the display. From FIG. 5, the glass or plastic substrate 501 is positioned below pixel electronics 502, located below the UV LED layer 503. Above the UV LED layer is a transparent conductor 504, a layer of UV/Lamp of white phosphor elements 505, a color filter or filters 506 bordering the layer of UV/Lamp of white phosphor elements 505, and encapsulation or surface layer 507. The color filter or filters 506 can be an LCD type color filter or filter arrangement.

When UV LEDs are employed, such as in FIGS. 3, 4, and 5, the UV LED layer may be deposited using MOCVD (metalorganic CVD) to properly deposit and distribute an appropriate quality of material and doping profiles for the p-n junctions used in the UV LED layer. To insure high-quality material, epitaxial growth of the UV LED layer can be promoted with the use of an appropriate intervening layer 310 (FIG. 3) or layers. For the UV LED to function properly, the UV LED layer may be composed of p-type and n-type sublayers. To complete the circuit, a conductive UV transparent layer is employed. ITO (indium tim oxicde or indium doped tin oxide or like material) may be used as such a conductive UV transparent layer. Deposition of phosphors is generally well known, and such deposition may occur using, for example, suspension coating, etc.

FIGS. 1-5 therefore illustrate construction of the display device based on UV light emitters using various uniform layers. FIGS. 6-9 show the means for preparing multiple pixels in this UV emitter environment, with different color pixel regions shown. From FIG. 6, substrate 601 sits below pixel electronics layer 602, which includes three pixel electronics layer sections 602a, 602b, and 602c and three metal lines 602d, 602e, and 602f. Electron accelerator layer 603 is shown above the pixel electronics layer 602. UV emission layer 604 is above the electron acceleration layer 603, covered by transparent conductor layer 605 and surface layer 606. Included within surface layer 606 are color phosphor elements red 606a, green 606b, and blue 606c. With no dielectric layer, this embodiment contemplates a non-conductive substrate 601.

Figure 7:
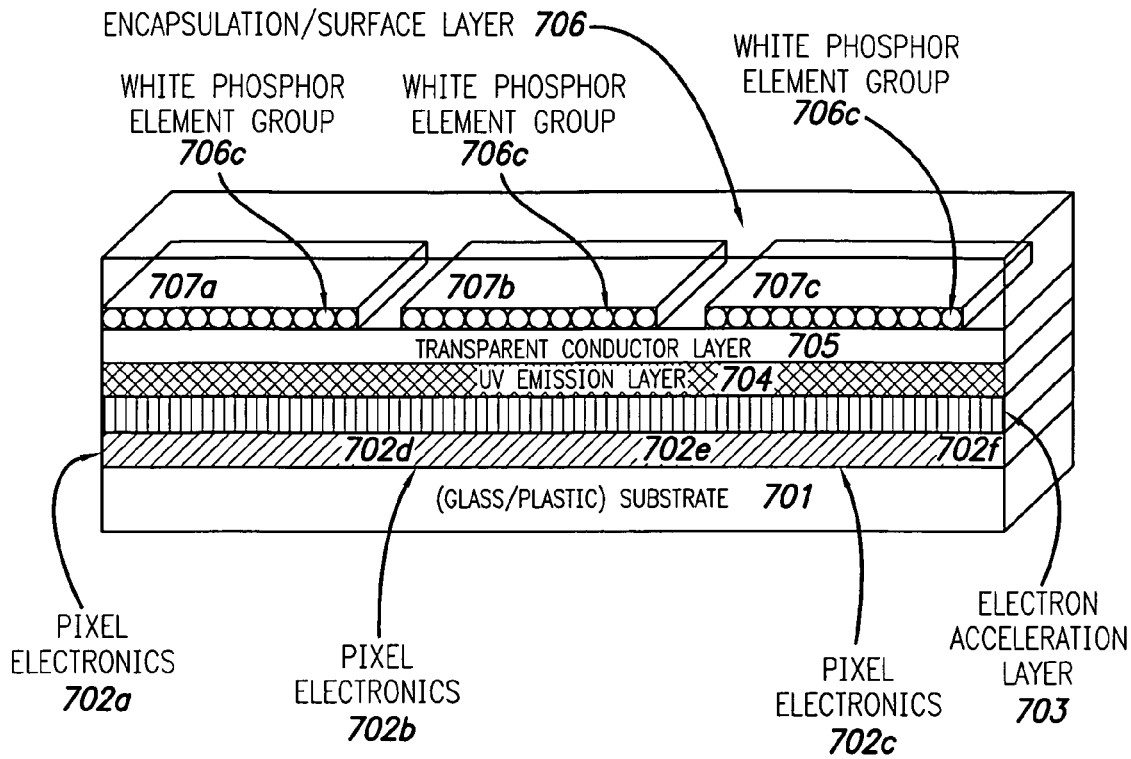
FIG. 7 is a display apparatus embodiment illustrating white phosphor elements and color filters.
Figure 8:
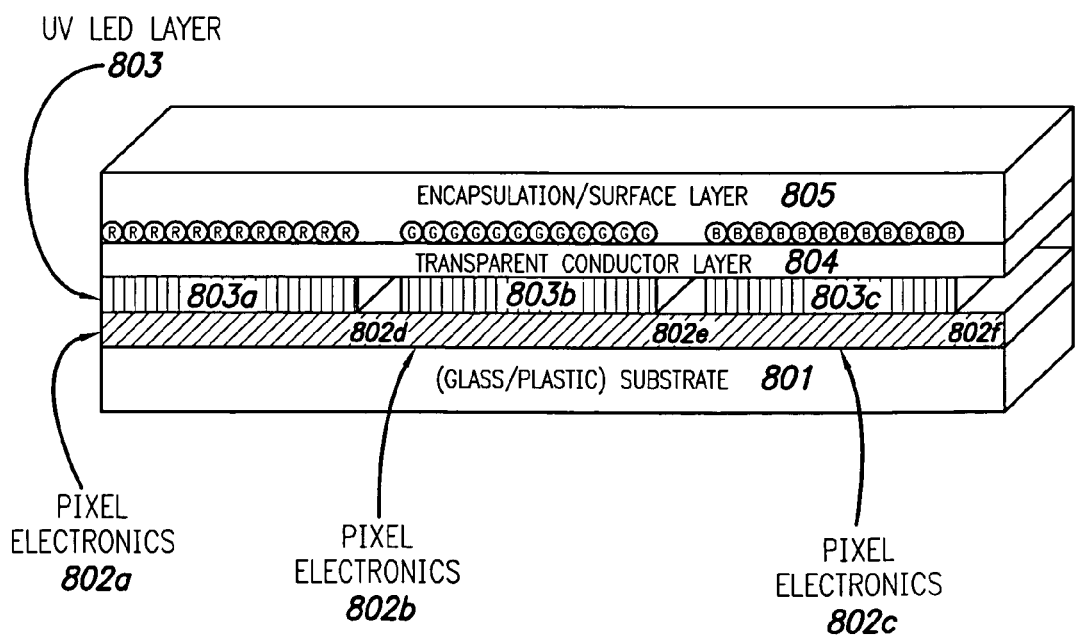
FIG. 8 shows an embodiment of a display apparatus including UV LED elements in an UV LED layer in addition to metal lines in the pixel electronics.

FIG. 7 employs white phosphor elements with colored filters and includes the electron acceleration layer. From FIG. 7, substrate 701 sits below pixel electronics layer 702, which includes three pixel electronics layer sections 702a, 702b, and 702c and three metal lines 702d, 702e, and 702f. If the substrate 701 is conductive, such as formed from stainless steel, a dielectric layer (not shown) may be employed. Electron accelerator layer 703 is shown above the pixel electronics layer 702. UV emission layer 704 is above the electron acceleration layer 703, covered by transparent conductor layer 705 and surface layer 706. Included within surface layer 706 are groups of white phosphor elements 706a, 706b, and 706c. These white phosphor elements 706a, 706b, and 706c are each covered with red color filter 707a, green color filter 707b, and blue color filter 707c, respectively. The color filters employed may be similar to those used in LCD applications.

FIG. 8 again employs the color phosphor elements but omits the electron acceleration layer and includes UV LEDs. From FIG. 8, non-conducting substrate 801 sits below pixel electronics layer 802, which includes three pixel electronics layer sections 802a, 802b, and 802c and three metal lines 802d, 802e, and 802f. UV LED layer 803 is positioned atop the pixel electronics layer 802, with UV LED layer 803 comprising UV LED sections 803a, 803b, and 803c positioned above pixel electronics layer sections 802a, 802b, and 802c, respectively. UV LED layer 803 is covered by transparent conductor layer 804 and surface layer 805. Included within surface layer 805 or deposited prior to an encapsulation layer are color phosphor elements red 805a, green 805b, and blue 805c.

The drive/address lines or metal lines, such as metal lines 802d, 802e, and 802f, are formed of metal or other conductive material appropriate for delivering all voltages and currents. Pixel electronics in the pixel electronics layer, such as pixel electronics layer 802, include transistors, connections, and other electronics components for forming adequate light output. An active matrix addressing scheme may be employed. Phosphor persistence may enable passive matrix addressing, whereby pixel electronics may be greatly simplified or eliminated.

Figure 9:
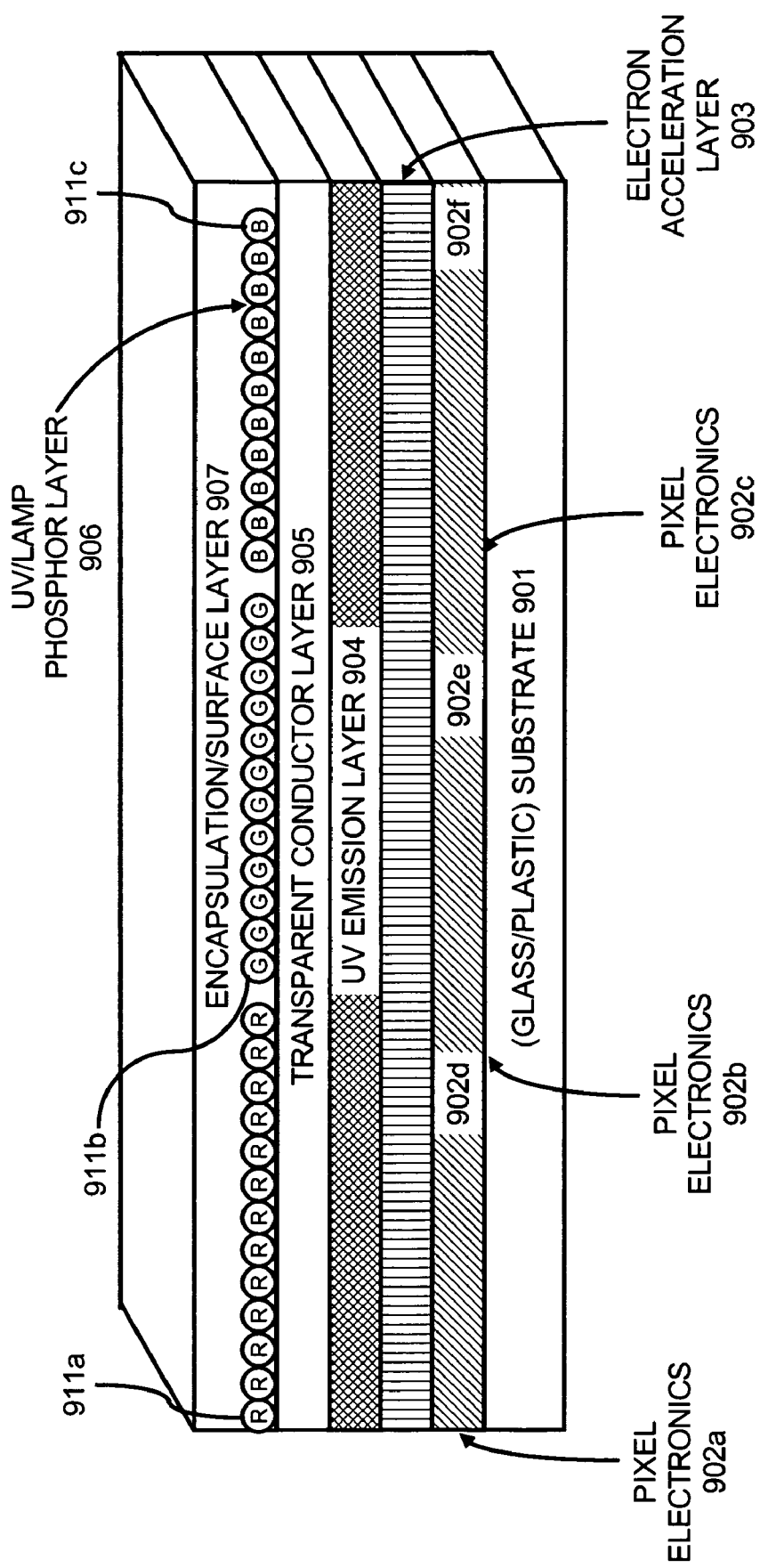
FIG. 9 is an embodiment altering the quantity of phosphor elements to correct color gamut spatiality.

Use of RGB phosphors, such as shown in FIGS. 1-4, 6, and 8 may present problems in color gamut and uniformity if the driving circuitry for all colors is similar or identical. FIG. 9 illustrates a construction, for example, where such color gamut problems are encountered and addressed by increasing the area of red emission, decreasing the area of blue emission, and keeping the area of green emission unchanged. The area for each pixel (color) can be changed depending on the efficiencies of the various phosphors, with higher efficiency phosphors having less area. A proper white result can thus be obtained by "tuning" the various phosphors provided. From FIG. 9, the number of green color phosphors or phosphor elements 911b is 12, while the number of blue phosphors or phosphor elements 911c is 11, and the number of red phosphors or phosphor elements 911a is 13. Using more or fewer elements can resolve color gamut issues. The areas surrounding the pixels are typically colored black to improve contrast irrespective of the light generating scheme.

Drive circuitry may be provided, where the drive circuitry provides electrical signals in the form of current and/or voltage deviations to drive UV LEDs or the electron acceleration/UV emitter structures, using the metal lines included in the pixel electronics as shown. Such drive circuitry may be similar to that commonly used in OLEDs. The entire array may be framed to contain the display layered in the manner shown, including appropriate drive electronics, and to protect the layered display from external effects. The present system may be fabricated in a roll-to-roll process, and uses a single UV light emission material to produce a display exhibiting good to excellent lifetime, color gamut, brightness, contrast, and efficacy (light output relative to power input) qualities.

The use of UV phosphors rather than cathodoluminescent phosphors tends to minimize the principal cause of phosphor degradation, namely the columbic destruction of insulating materials.

It will be appreciated to those of skill in the art that the present design may be applied to other color display type systems. Although there has been hereinabove described an apparatus and a method for displaying color images using UV light emitters within a lightweight, thin, layered design, for the purpose of illustrating the manner in which the invention may be used to advantage, it should be appreciated that the invention is not limited thereto. Accordingly, any and all modifications, variations, or equivalent arrangements which may occur to those skilled in the art, should be considered to be within the scope of the present invention as defined in the appended claims.

What is claimed is:

1. A display apparatus, comprising:
   a substrate layer;
   a pixel electronics layer positioned above and in direct contact with the substrate layer;
   an ultraviolet (UV) emission layer located above and the pixel electronics layer;
   an electron acceleration layer positioned above and in direct contact with said pixel electronics layer and below and in direct contact with said UV emission layer;
   a transparent conductor layer located above the UV emission layer;
   a phosphor layer comprising a plurality of phosphor elements positioned above the transparent conductor layer; and
   a surface layer covering said phosphor layer.

2. The display apparatus of claim 1, wherein said phosphor layer comprises a plurality of white phosphor elements in combination with a plurality of colored filters.

3. The display apparatus of claim 1, wherein said phosphor layer comprises a plurality of colored phosphor elements, and said plurality of colored phosphor elements comprises at least one red phosphor element, at least one green phosphor element, and at least one blue phosphor element.

4. The display apparatus of claim 3, wherein different quantities of colored phosphor elements are provided for one color than are provided for another color.

5. The display apparatus of claim 1, wherein said UV emission layer comprises a UV Light Emitting Diode (LED) layer that is composed of p-type and n-type sub-layers.

6. The display apparatus of claim 5, further comprising a layer or layers of materials that promote epitaxial growth of LED materials above said pixel electronics layer and below said UV LED layer.

7. The display apparatus of claim 1, wherein said electron acceleration layer comprises one from a group comprising:
   porous silicon; and
   carbon nanotubes.

8. The display apparatus of claim 1, wherein said UV emission layer comprises a material whose band width is such that UV light emission can be stimulated by electrons of sufficient energy.

9. A method for fabricating a display apparatus, comprising:
   providing a substrate layer;
   providing a pixel electronics layer positioned above and in direct contact with the substrate layer;
   providing an ultraviolet (UV) emission layer above and the pixel electronics layer;
   providing an electron acceleration layer above and in direct contact with the pixel electronics layer and below and in direct contact with the UV emission layer;
   providing a transparent conductor layer above the UV emission layer;
   providing a phosphor layer comprising a plurality of phosphor elements positioned above the transparent conductor layer; and
   providing a surface layer over said phosphor layer.

10. The method of claim 9, wherein said phosphor layer comprises a plurality of white phosphor elements in combination with a plurality of colored filters.

11. The method of claim 9, wherein providing said phosphor layer comprises providing a plurality of colored phosphor elements, and said plurality of colored phosphor elements comprises at least one red phosphor element, at least one green phosphor element, and at least one blue phosphor element.

12. The method of claim 11, wherein different quantities of colored phosphor elements are provided for one color than are provided for another color.

13. The method of claim 9, wherein the substrate is formed of a conductive material.

14. The method of claim 13, wherein said electron acceleration layer comprises one from a group comprising:
   porous silicon; and
   carbon nanotubes.

15. The method of claim 13, wherein said UV emission layer comprises a material whose band width is such that UV light emission can be stimulated by electrons of sufficient energy.

16. The method of claim 9, wherein said UV emission layer comprises a UV Light Emitting Diode (LED) layer that is composed of p-type and n-type sub-layers.

17. The method of claim 16, further comprising providing a layer or layers of materials that promote epitaxial growth of LED materials above said pixel electronics layer and below said UV LED layer.

18. An ultraviolet emission display apparatus, comprising:
   a substrate layer;
   a pixel electronics layer positioned above the substrate layer, said pixel electronics layer comprising electronics to drive the ultraviolet emission display apparatus;
   an isolation dielectric layer formed above said substrate layer and below said pixel electronics layer;
   an ultraviolet (UV) emission layer located above the pixel electronics layer, said UV emission layer comprising a layer having a plurality of UV light emitting diodes (LEDs);
   an electron acceleration layer positioned between and in direct contact with the pixel electronics layer and the UV emission layer, wherein the pixel electronics layer is interposed between and in direct contact with the isolation dielectric layer and the electron acceleration layer, and wherein the pixel electronics layer is configured to individually control the plurality of UV LEDs;
   a transparent conductor layer; and
   a phosphor layer comprising a plurality of phosphor elements, said phosphor layer positioned above the UV LED layer.

19. The ultraviolet emission display apparatus of claim 18, wherein the substrate layer is formed of stainless steel.

20. The ultraviolet emission display apparatus of claim 18, wherein said substrate layer is formed of a conductive material.

21. The ultraviolet emission display apparatus of claim 18, further comprising a surface layer covering said phosphor layer.

22. The ultraviolet emission display apparatus of claim 18, wherein said phosphor layer comprises a plurality of white phosphor elements in combination with a plurality of colored filters.

23. The ultraviolet emission display apparatus of claim 18, wherein said phosphor layer comprises a plurality of colored phosphor elements, and said plurality of colored phosphor elements comprises at least one red phosphor element at least one green phosphor element, and at least one blue phosphor element.

* * * * *